United States Patent
Lee et al.

(10) Patent No.: US 8,872,581 B2
(45) Date of Patent: Oct. 28, 2014

(54) CLASS-D POWER AMPLIFIER CAPABLE OF REDUCING ELECTROMAGNETIC INTERFERENCE AND TRIANGULAR WAVE GENERATOR THEREOF

(71) Applicant: Princeton Technology Corporation, New Taipei (TW)

(72) Inventors: Yung-Ming Lee, New Taipei (TW); Ming-Chung Li, Taipei (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 0 days.

(21) Appl. No.: 13/759,019

(22) Filed: Feb. 4, 2013

(65) Prior Publication Data

US 2013/0335143 A1    Dec. 19, 2013

(30) Foreign Application Priority Data

Jun. 14, 2012 (TW) .............................. 101121308 A

(51) Int. Cl.
*H03F 3/38* (2006.01)
*H03F 3/217* (2006.01)
*H03K 4/06* (2006.01)

(52) U.S. Cl.
CPC ................ *H03F 3/2171* (2013.01); *H03K 4/06* (2013.01)

USPC ............................................ 330/10; 330/251

(58) Field of Classification Search
CPC ........................................................ H03F 3/38
USPC ........................................ 330/10, 251, 207 A
See application file for complete search history.

(56) References Cited

U.S. PATENT DOCUMENTS

| 5,767,740 | A * | 6/1998 | Fogg ................................ 330/10 |
| 7,315,202 | B2 * | 1/2008 | Tsuji ................................ 330/10 |
| 7,332,962 | B2 * | 2/2008 | Wu et al. ......................... 330/251 |
| 8,536,938 | B2 * | 9/2013 | Walker et al. .................... 330/10 |
| 2008/0303563 | A1 * | 12/2008 | Kubo ............................. 327/131 |

* cited by examiner

*Primary Examiner* — Henry Choe
(74) *Attorney, Agent, or Firm* — Winston Hsu; Scott Margo

(57) ABSTRACT

A class-D power amplifier capable of reducing electromagnetic interference includes an integrator, a triangular wave generator, a comparator, a gate driver, a feedback circuit, and an output stage circuit. The integrator is used for receiving an input signal and potential of ground, and outputting a first voltage. The comparator is used for comparing the first voltage with a triangular wave generated by the triangular wave generator to output a pulse-width modulation signal. The gate driver is used for driving the output stage circuit to output an output voltage according to the pulse-width modulation signal. Therefore, the class-D power amplifier reduces the electromagnetic interference by the triangular wave.

3 Claims, 10 Drawing Sheets

… (US 8,872,581 B2)

CLASS-D POWER AMPLIFIER CAPABLE OF REDUCING ELECTROMAGNETIC INTERFERENCE AND TRIANGULAR WAVE GENERATOR THEREOF

BACKGROUND OF THE INVENTION

1. Field of the Invention

The present invention relates a class-D power amplifier and a triangular wave generator, and particularly to a class-D power amplifier and a triangular wave generator that are capable of reducing electromagnetic interference.

2. Description of the Prior Art

A class-D power amplifier is used for generating an output voltage according to an input signal and a triangular wave, where the output voltage is a pulse-width modulation voltage. Then, the output voltage is fed back to an input terminal of the class-D power amplifier through a feedback resistor, and filtered by a low-pass filter to generate an audio signal. Thus, a speaker can convert the audio signal into sound.

Please refer to FIG. 1A, FIG. 1B, and FIG. 1C. FIG. 1A is a diagram illustrating a triangular wave generated by a triangular wave generator, FIG. 1B is a diagram illustrating an output voltage outputted by a class-D power amplifier, and FIG. 1C is a diagram illustrating a fast Fourier transform (FFT) analysis being executed on the output voltage outputted by the class-D power amplifier. As shown in FIG. 1A and FIG. 1B, because a frequency of the triangular wave in the prior art is fixed, a frequency of the output voltage is also fixed. As shown in FIG. 1C, if the fast Fourier transform analysis is executed on the output voltage, a spectrogram in FIG. 1C may exhibit spikes. That is to say, the spectrogram in FIG. 1C may exhibit a fixed frequency and harmonics of the fixed frequency. Therefore, the spikes may interfere with an electronic device (e.g. a radio) if the spikes are just located on a band required by the electronic device.

SUMMARY OF THE INVENTION

An embodiment provides a class-D power amplifier capable of reducing electromagnetic interference. The class-D power amplifier includes an integrator, a triangular wave generator, a comparator, a gate driver, an output stage circuit, and a feedback circuit. The integrator is used for receiving an input signal and potential of ground, and outputting a first voltage. The triangular wave generator is used for receiving a plurality of control signals to adjust a frequency of a triangular wave outputted thereof. The comparator is coupled to the integrator and the triangular wave generator for comparing the first voltage outputted by the integrator with the triangular wave to generate a pulse-width modulation signal. The gate driver is coupled to the comparator for receiving the pulse-width modulation signal, and generating a first output signal and a second output signal. The output stage circuit is coupled to the gate driver for outputting an output voltage according to the first output signal and the second output signal. The feedback circuit is coupled between the output stage circuit and the integrator for providing a feedback voltage to the integrator. The plurality of control signals is used for controlling an output current of the triangular wave generator to adjust a frequency of the triangular wave according to the output current of the triangular wave generator.

Another embodiment provides a triangular wave generator for generating a variable frequency triangular wave. The triangular wave generator includes a variable current source module, an energy storage module, a comparison module, and a control module. The variable current source module is used for receiving a plurality of control signals to adjust an output current of the variable current source module. The energy storage module is coupled to the variable current source module for receiving the output current of the variable current source module to maintain a storage voltage. The comparison module is coupled to the energy storage module for comparing the storage voltage, a high reference voltage, and a low reference voltage to generate a plurality of comparison signals. The control module is coupled between the comparison module and the variable current source module for receiving the plurality of comparison signals, and generating the plurality of control signals to adjust the output current of the variable current source module. A frequency of the variable frequency triangular wave is changed with the output current of the variable current source module.

The present invention provides a class-D power amplifier capable of reducing electromagnetic interference. The class-D power amplifier utilizes control signals generated by a counter module to control variable currents provided by a variable current source, resulting in a frequency of a triangular wave generated by a triangular wave generator being not fixed. Therefore, after a fast Fourier transform analysis is executed on an output voltage generated according to the triangular wave, a spectrogram of the output voltage does not exhibit a fixed frequency and harmonics of the fixed frequency. Thus, the class-D power amplifier of the present invention is capable of reducing the electromagnetic interference.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
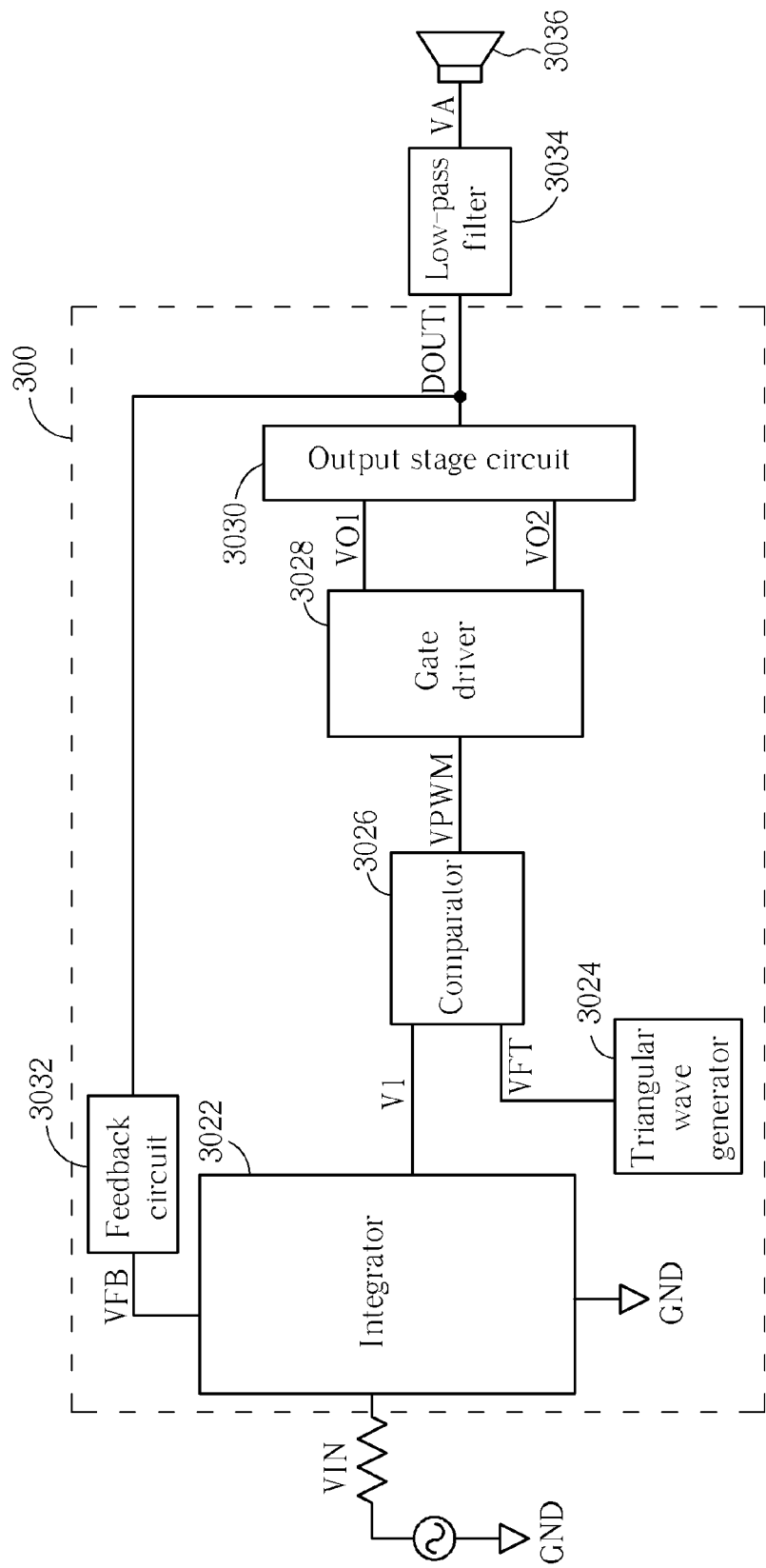
FIG. 2 is a function block diagram illustrating a class-D power amplifier capable of reducing electromagnetic interference.

Please refer to FIG. 2. FIG. 2 is a function block diagram illustrating a class-D power amplifier 300 capable of reducing electromagnetic interference. The class-D power amplifier 300 includes an integrator 3022, a triangular wave generator 3024, a comparator 3026, a gate driver 3028, an output stage circuit 3030, and a feedback circuit 3032.

As shown in FIG. 2, the integrator 3022 is used for receiving an input signal VIN and potential of the ground GND, and outputting a first voltage V1. The triangular wave generator 3024 is used for receiving a plurality of control signals to adjust a frequency of a triangular wave VFT outputted thereof. The comparator 3026 is coupled to the integrator 3022 and the triangular wave generator 3024 for comparing the first voltage V1 outputted by the integrator 3022 with the triangular wave VFT of the triangular wave generator 3024 to generate a pulse-width modulation signal VPWM. The gate driver 3028 is coupled to the comparator 3026 for receiving the pulse-width modulation signal VPWM, and generating a first output signal VO1 and a second output signal VO2. The output stage circuit 3030 is coupled to the gate driver 3028 for outputting an output voltage DOUT according to the first output signal VO1 and the second output signal VO2. The feedback circuit 3032 is coupled between the output stage circuit 3030 and the integrator 3022 for providing a feedback voltage VFB to the integrator 3022. In addition, the triangular wave generator 3024 can control the output current thereof through the plurality of control signals to adjust the frequency of the triangular wave VFT. The class-D power amplifier 300 further includes a low-pass filter 3034 coupled to the output stage circuit 3030 for converting and filtering the output voltage DOUT into an audio signal VA, where the audio signal VA is used for driving a speaker 3036.

Figure 3:
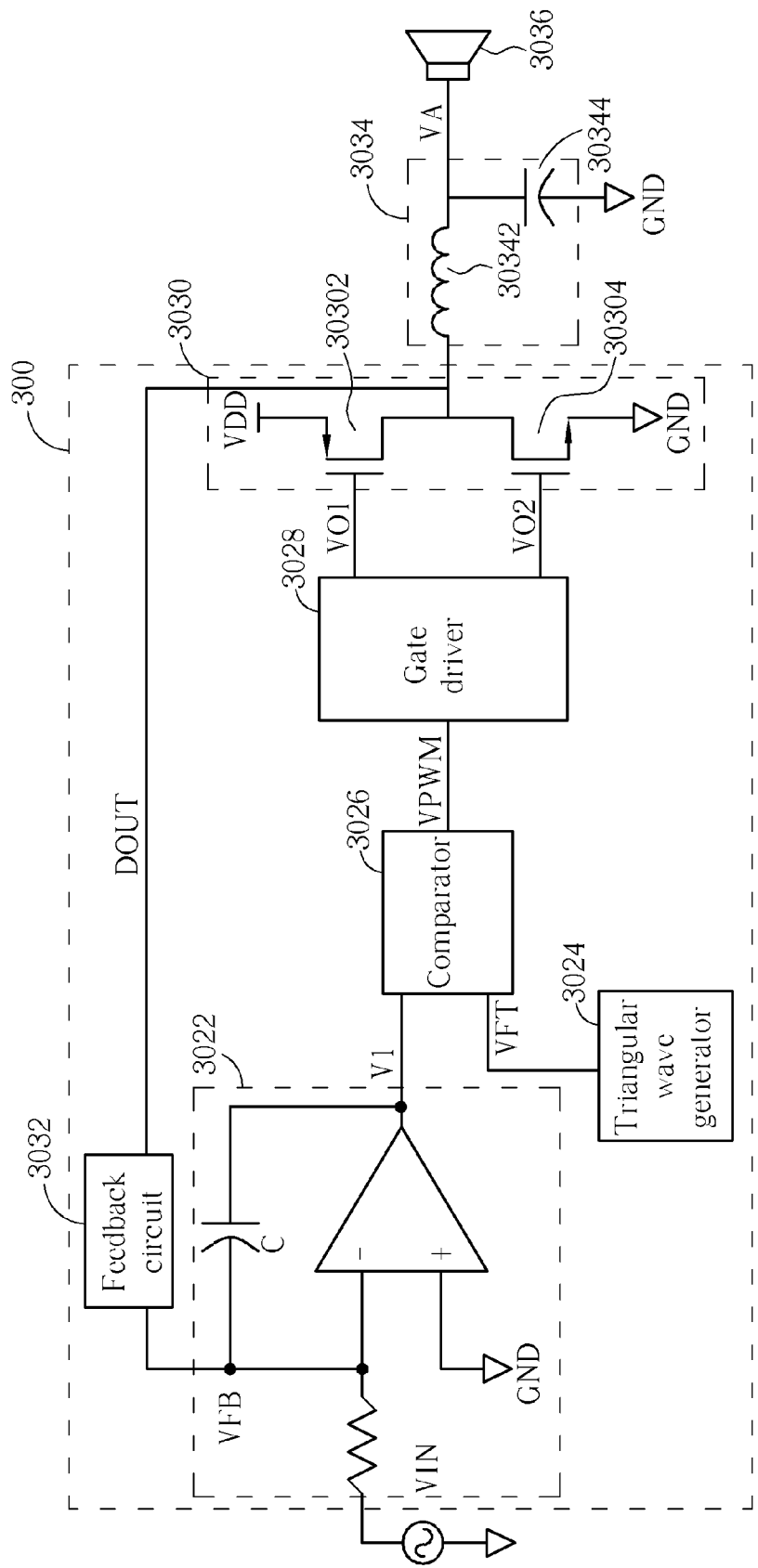
FIG. 3 is a diagram illustrating a class-D power amplifier according to an embodiment.

Please refer to FIG. 3. FIG. 3 is a diagram illustrating a class-D power amplifier 300 according to an embodiment. As shown in FIG. 3, the integrator 3022 has a first terminal for receiving the input signal VIN, a second terminal for receiving the feedback voltage VFB, a third terminal for outputting the first voltage V1 corresponding to the input signal VIN, and a fourth terminal coupled to the ground GND. The integrator 3022 is a firs-order integrator, and the integrator 3022 is composed of a resistor, a capacitor C, and an operational amplifier OP1. But, the present invention is not limited to the first-order integrator. That is to say, the integrator 3022 can be also a multi-order integrator.

As shown in FIG. 3, the triangular wave generator 3024 has an output terminal for generating the triangular wave VFT. The comparator 3026 has a first terminal coupled to the third terminal of the integrator 3022, a second terminal coupled to the triangular wave generator 3024, and an output terminal for outputting the pulse-width modulation signal VPWM, where the comparator 3026 is used for comparing the first voltage V1 with the triangular wave VFT to generate the pulse-width modulation signal VPWM, and the comparator 3026 can be a hysteresis comparator. The gate driver 3028 has a first terminal coupled to the output terminal of the comparator 3026, a first output terminal for outputting the first output signal VO1, and a second output terminal for outputting the second output signal VO2, where the gate driver 3028 is used for generating the first output signal VO1 and the second output signal VO2 according to the pulse-width modulation signal VPWM. The output stage circuit 3030 has a first input terminal coupled to the first output terminal of the gate driver 3028, a second input terminal coupled to the second output terminal of the gate driver 3028, and an output terminal for outputting the output voltage DOUT, where the output stage circuit 3030 is used for generating the output voltage DOUT according to the first output signal VO1 or the second output signal VO2, and the output voltage DOUT can be a pulse-width modulation voltage. The feedback circuit 3032 is coupled between the output terminal of the output stage circuit 3030 and the second terminal of the integrator 3022 for feeding back the output voltage DOUT to generate the feedback voltage VFB to the second terminal of the integrator 3022.

As shown in FIG. 3, the output stage circuit 3030 is composed of a P-type metal-oxide-semiconductor transistor 30302 and an N-type metal-oxide-semiconductor transistor 30304. The P-type metal-oxide-semiconductor transistor 30302 has a first terminal for receiving a second voltage VDD, a second terminal coupled to the first input terminal of the output stage circuit 3030, and a third terminal coupled to the output terminal of the output stage circuit 3030. The N-type metal-oxide-semiconductor transistor 30304 has a first terminal coupled to the third terminal of the P-type metal-oxide-semiconductor transistor 30302, a second terminal coupled to the second input terminal of the output stage circuit 3030, and a third terminal coupled to the ground GND. The output stage circuit 3030 is used for turning on the P-type metal-oxide-semiconductor transistor 30302 according to the first output signal VO1 or turning on the N-type metal-oxide-semiconductor transistor 30304 according to the second output signal VO2 to generate the output voltage DOUT. In another embodiment of the present invention, the P-type metal-oxide-semiconductor transistor 30302 and the N-type metal-oxide-semiconductor transistor 30304 can be power metal-oxide-semiconductor transistors. In one embodiment of the present invention, the low-pass filter 3034 includes an inductor 30342 and a capacitor 30344. The inductor 30342 has a first terminal coupled to the output terminal of the output stage circuit 3030, and a second terminal for outputting the audio signal VA. The capacitor 30344 has a first terminal coupled to the second terminal of the inductor 30342, and a second terminal coupled to the ground GND.

Figure 4:
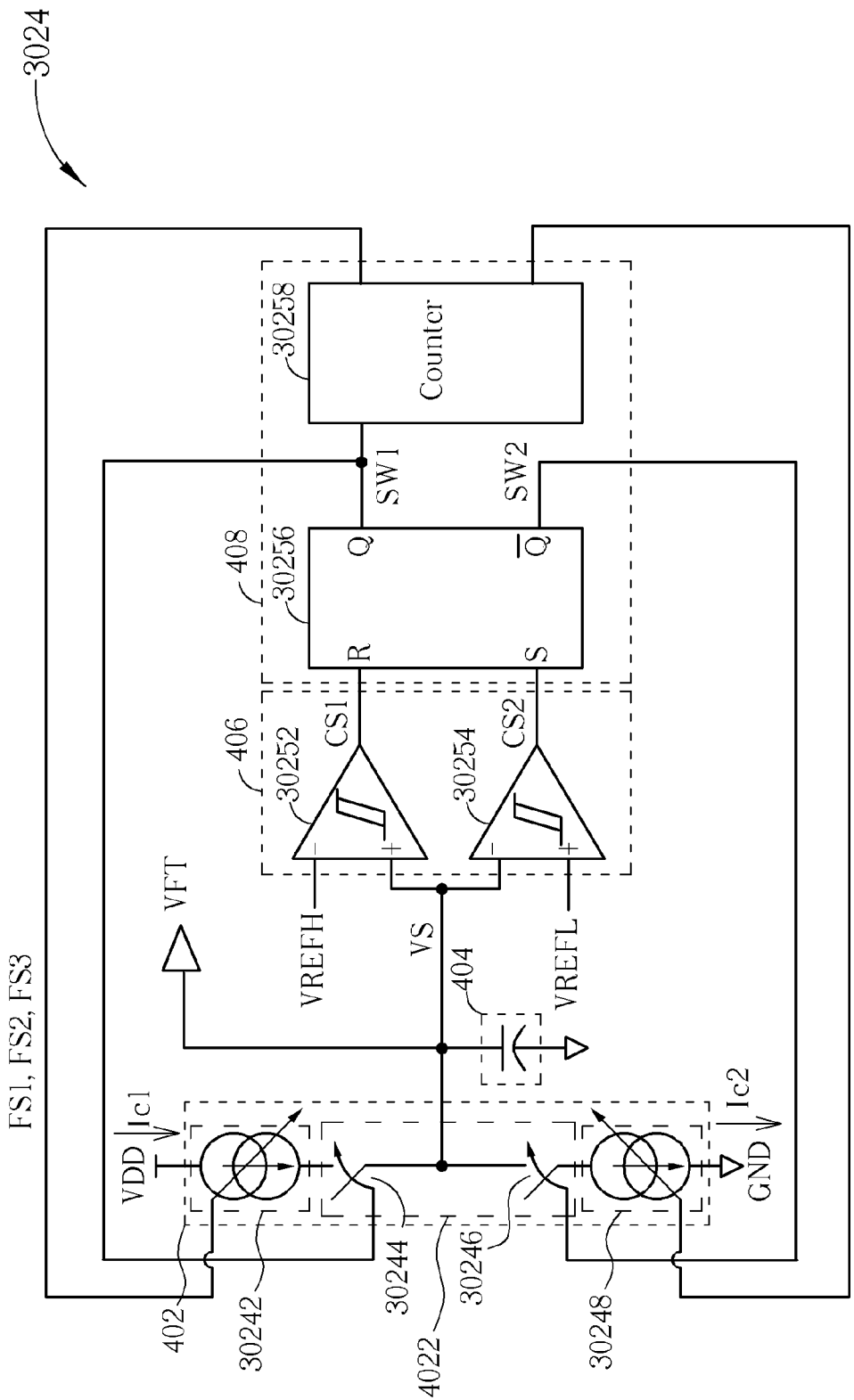
FIG. 4 is a diagram illustrating the triangular wave generator.

Please refer to FIG. 4. FIG. 4 is a diagram illustrating the triangular wave generator 3024. As shown in FIG. 4, the triangular wave generator 3024 includes a variable current source module 402, an energy storage module 404, a comparison module 406, and a control module 408. The variable current source module 402 is used for receiving the plurality of control signals to adjust an output current of the variable current source module 402. The energy storage module 404 (e.g. a capacitor) is coupled to the variable current source module 402 for receiving the output current of the variable current source module 402 to maintain a storage voltage VS. The comparison module 406 is coupled to the energy storage module 404 for comparing the storage voltage VS, a high reference voltage VREFH, and a low reference voltage VREFL to generate a plurality of comparison signals (e.g. a first comparison signal CS1 and a second comparison signal CS2). The control module 408 is coupled between the comparison module 406 and the variable current source module 402 for receiving the first comparison signal CS1 and the second comparison signal CS2, and generating the plurality of control signals (e.g. first control signals FCS1, FCS2, and FCS3 and second control signals SCS1, SCS2, and SCS3) to adjust the output current of the triangular wave generator 3024. The output current of the triangular wave generator 3024 includes the output current of the variable current source module 402.

The variable current source module 402 includes a first variable current source module 30242, a second variable current source module 30248, and a switch module 4022. The switch module 4022 includes a first switch 30244 and a second switch 30246. The control module 408 includes a flip-flop module 30256 and a counter module 30258. The comparison module 406 includes a first comparator 30252 and a second comparator 30254.

As shown in FIG. 4, the first variable current source module 30242 has a first terminal for receiving the second voltage VDD, one or more first control terminals for receiving one or more first control signals, and a second terminal, where each control terminal of one or more first control terminals receives a corresponding first control signals. The first switch 30244 has a first terminal coupled to the second terminal of the first variable current source module 30242, a second terminal for receiving a first switch signal SW1, and a third terminal coupled to the output terminal of the triangular wave generator 3024. The second switch 30246 has a first terminal coupled to the third terminal of the first switch 30244, a second terminal for receiving a second switch signal SW2, and a third terminal.

The second variable current source module 30248 has a first terminal coupled to the third terminal of the second switch 30246, one or more second control terminals for receiving one or more second control signals, and a second terminal coupled to the ground GND, where each control terminal of one or more second control terminals receives a corresponding second control signal. The energy storage module 404 has a first terminal coupled to the output terminal of the triangular wave generator 3024, and a second terminal coupled to the ground GND. The first comparator 30252 has a first terminal for receiving the high reference voltage VREFH, a second terminal coupled to the first terminal of the energy storage module 404, and an output terminal for outputting the first comparison signal CS1, where the first comparator 30252 is used for comparing the high reference voltage VREFH with a voltage of the first terminal of the energy storage module 404 to output the first comparison signal CS1. The second comparator 30254 has a first terminal coupled to the first terminal of the energy storage module 404, a second terminal for receiving the low reference voltage VREFL, and a output terminal for outputting the second comparison signal CS2, where the second comparator 30254 is used for comparing the low reference voltage VREFL with the voltage of the first terminal of the energy storage module 404 to output the second comparison signal CS2.

The flip-flop module 30256 has a reset terminal R coupled to the output terminal of the first comparator 30252, a set terminal S coupled to the output terminal of the second comparator 30254, an output terminal Q for outputting the first switch signal SW1, and an inverse output terminal $\overline{Q}$ for outputting the second switch signal SW2. The counter module 30258 has an input terminal coupled to the output terminal Q of the flip-flop module 30256, and a first output terminal and a second output terminal. The first output terminal and the second output terminal of the counter module 30258 output first control signals (e.g. the first control signals FCS1, FCS2, FCS3) to the first variable current source module 30242 and second control signals (e.g. the second control signals SCSI, SCS2, SCS3) to the second variable current source module 30248, respectively, where bits of the counter module 30258 are determined by a requirement of a user. In addition, a counting nIc1n the counter module 30258 is enabled. For example, the counter module 30258 is a 3-bit counter module. But, the present invention is not limited to the counter module 30258 being the 3-bit counter module. In addition, the first switch 30244 and the second switch 30246 can be N-type metal-oxide-semiconductor transistors, P-type metal-oxide-semiconductor transistors, or and a combination thereof.

When the first variable current source module 30242 starts to provide a variable current Ic1 to charge the energy storage module 404, if the voltage of the first terminal of the energy storage module 404 is higher than the high reference voltage VREFH, the first comparator 30252 outputs the first comparison signal CS1 to the reset terminal R of the flip-flop module 30256. Meanwhile, the inverse output terminal $\overline{Q}$ outputs the second switch signal SW2, so that the second switch 30246 is turned on. Then, the variable current Ic1 stops charging the energy storage module 404, and a variable current Ic2 provided by the second variable current source module 30248 discharges the energy storage module 404 to the ground GND through the second switch 30246 and the second variable current source module 30248 until the voltage of the first terminal of the energy storage module 404 is lower than the low reference voltage VREFL.

When the voltage of the first terminal of the energy storage module 404 is lower than the low reference voltage VREFL, the second comparator 30254 outputs the second comparison signal CS2 to the set terminal S of the flip-flop module 30256. Meanwhile, the output terminal Q of the flip-flop module 30256 outputs the first switch signal SW1, so that the first switch 30244 is turned on. In addition, the first switch signal SW1 also enables the counter module 30258, so the counter module 30258 outputs the first control signals and the second control signals to adjust the variable current Ic1 and the variable current Ic2 according to the first switch signal SW1. Then, the energy storage module 404 stops discharging to the ground GND, and the variable current Ic1 provided by the first variable current source module 30242 starts to charge the energy storage module 404 again until the voltage of the first terminal of the energy storage module 404 is higher than the high reference voltage VREFH. Thus, the above mentioned processes of the variable current Ic1 charging the energy storage module 404 and the variable current Ic2 discharging the energy storage module 404 are repeated, and then the triangular wave generator 3024 can generate the triangular wave VFT with the variable frequency.

Figure 5:
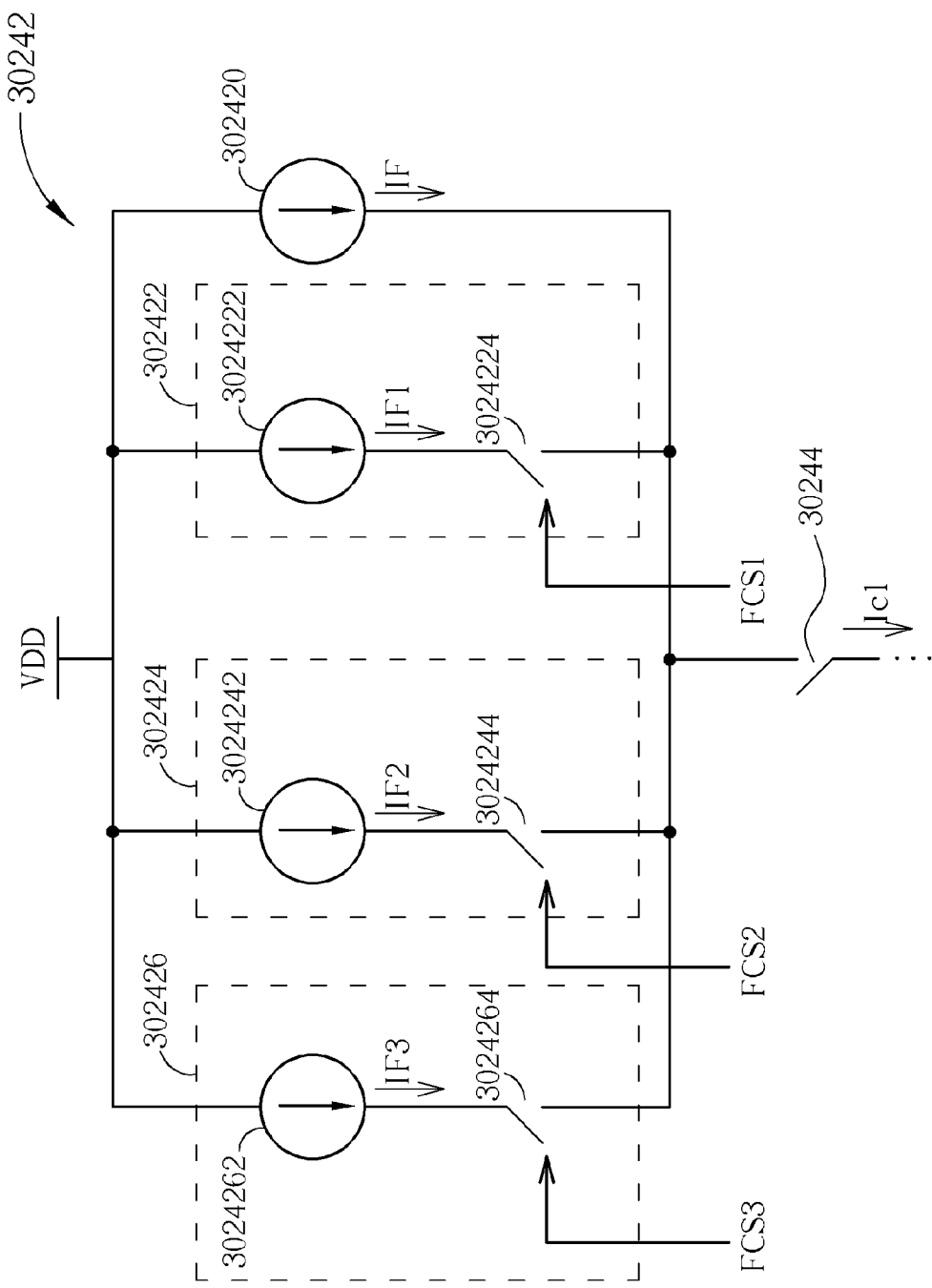
FIG. 5 is a diagram illustrating the first variable current source module.

Please refer to FIG. 5. FIG. 5 is a diagram illustrating the first variable current source module 30242. The first variable current source module 30242 includes a first fixed current source 302420 and three first fine-tune current circuits 302422, 302424, and 302426. But, in the present invention, the number of the first fine-tune current circuits is not limited to three, and varies with the requirement of the user. The first fixed current source 302420 has a first terminal coupled to the second voltage VDD, and a second terminal coupled to the first terminal of the first switch 30244, where the first fixed current source 302420 is used for providing a first fixed current IF.

As shown in FIG. 5, in one embodiment of the present invention, each first fine-tune current circuit of the first fine-tune current circuits 302422, 302424, and 302426 is composed of a fine-tune current source and a fine-tune switch. For example, the first fine-tune current circuit 302422 includes a first fine-tune current source 3024222 and a first fine-tune switch 3024224; the first fine-tune current circuit 302424 includes a first fine-tune current source 3024242 and a first fine-tune switch 3024244; and the first fine-tune current circuit 302426 includes a first fine-tune current source 3024262 and a first fine-tune switch 3024264. The first fine-tune current source 3024222 is coupled between the second voltage VDD and the first fine-tune switch 3024224 for providing a first fine-tune current IF1 through the first fine-tune switch 3024222, where operation of the first fine-tune switch 3024224 is controlled by the first control signal FCS1. In addition, structures of the first fine-tune current circuits 302424 and 302426 are the same as the structure of the first fine-tune current circuit 302422, so further description thereof is omitted for simplicity.

In addition, the first fine-tune currents IF1, IF2, and IF3 are much smaller than the first fixed current IF, and the variable current Ic1 is a sum of the first fixed current IF and a combination of the first fine-tune currents IF1, IF2, and IF3. For example, if the first control signal FCS1 is enabled, and the first control signals FCS2 and FCS3 are disabled, the variable current Ic1 is equal to a sum of the first fixed current IF and the first fine-tune current IF1; and if the first control signals FCS1 and FCS2 are enabled, and the first control signal FCS3 is disabled, the variable current Ic1 is equal to a sum of the first fixed current IF, the first fine-tune current IF1, and the first fine-tune current IF2. Therefore, the first variable current source module 30242 can adjust the variable current Ic1 according to the first control signals (e.g. the first control signals FCS1, FCS2, FCS3) outputted by the counter module 30258.

Figure 6:
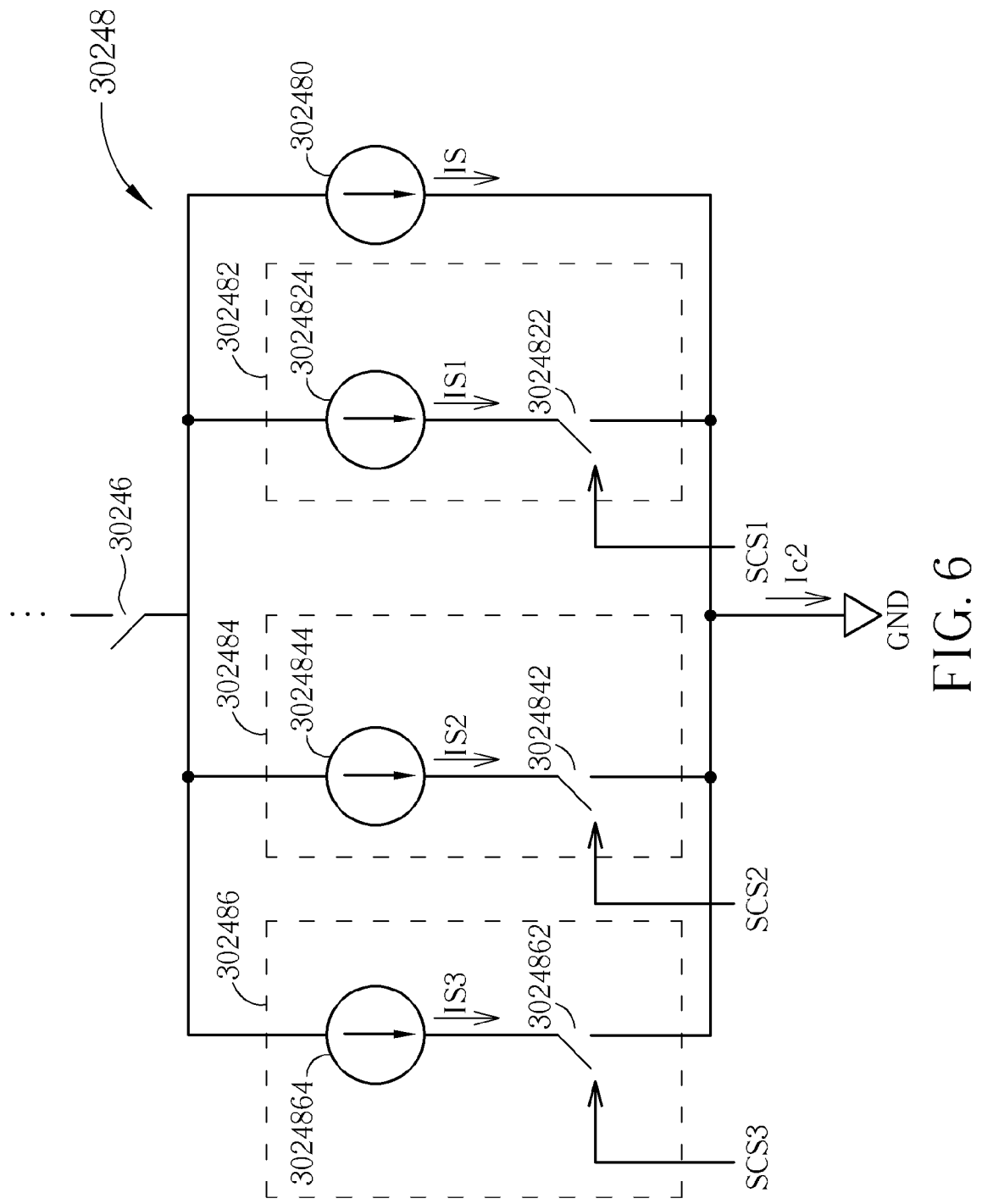
FIG. 6 is a diagram illustrating the second variable current source module.

Please refer to FIG. 6. FIG. 6 is a diagram illustrating the second variable current source module 30248. The second variable current source module 30248 includes a second fixed current source 302480 and three second fine-tune current circuits 302482, 302484, and 302486. But, in the present invention, the number of the second fine-tune current circuits is not limited to three, and varies with the requirement of the user. The second fixed current source 302480 has a first terminal coupled to the third terminal of the second switch 30246, and a second terminal coupled to the ground GND, where the second fixed current source 302480 is used for providing a second fixed current IS.

As shown in FIG. 6, in one embodiment of the present invention, each second fine-tune current circuit of the second fine-tune current circuits 302482, 302484, and 302486 is composed of a fine-tune current source and a fine-tune switch. For example, the second fine-tune current circuit 302482 includes a second fine-tune current source 3024824 and a second fine-tune switch 3024822; the second fine-tune current circuit 302484 includes a second fine-tune current source 3024844 and a second fine-tune switch 3024842; and the second fine-tune current circuit 302486 includes a second fine-tune current source 3024864 and a second fine-tune switch 3024862. The second fine-tune current source 3024824 is coupled between the third terminal of the second switch 30246 and the second fine-tune switch 3024822 for providing a second fine-tune current IS1 through the fine-tune switch 3024822, where operation of the fine-tune switch 3024822 is controlled by the second control signals SCS1. In addition, structures of the second fine-tune current circuit 302484 and 302486 are the same as the structure of the second fine-tune current circuit 302482, so further description thereof is omitted for simplicity.

In addition, as shown in FIG. 6, the second fine-tune currents IS1, IS2, and IS3 are much smaller than the second fixed current IS, and the variable current Ic2 is a sum of the second fixed current IS and a combination of the second fine-tune currents IS1, IS2, and IS3. For example, if the second control signals SCSI is enabled, and the second control signals SCS2 and SCS3 are disabled, the variable current Ic2 is equal to a sum of the second fixed current IS and the second fine-tune current IS1; and if the second control signals SCS1 and SCS2 are enabled, and the second control signal SCS3 is disabled, the variable current Ic2 is equal to a sum of the second fixed current IS, the second fine-tune current IS1, and the second fine-tune current IS2. Therefore, the second variable current source module 30248 can adjust the variable current Ic2 according to the second control signals (e.g. the second control signals SCS1, SCS2, SCS3) outputted by the counter module 30258.

Figure 7A:
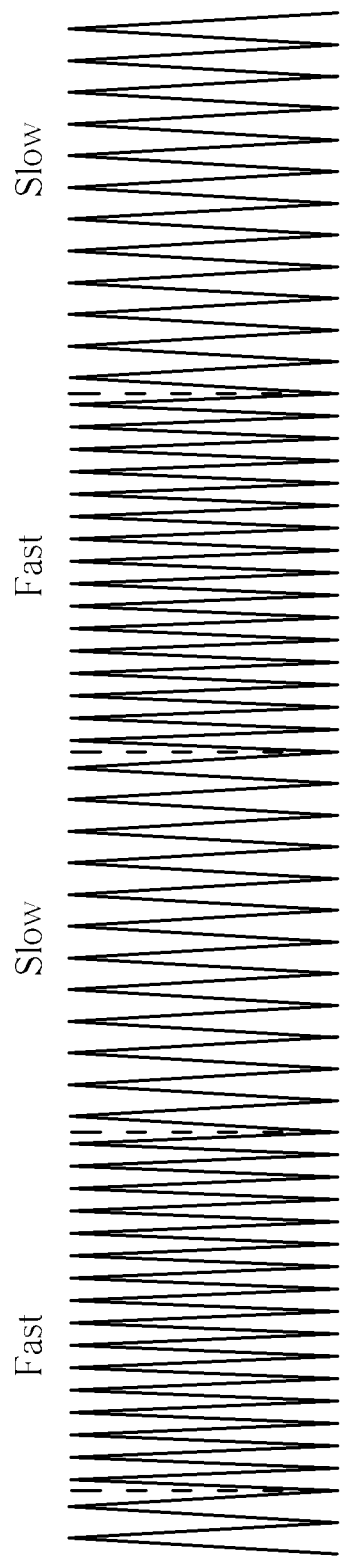
FIG. 7A is a diagram illustrating the triangular wave generated by the triangular wave generator.

Please refer to FIG. 7A. FIG. 7A is a diagram illustrating the triangular wave VFT generated by the triangular wave generator 3024. The first variable current source module 30242 and the second variable current source module 30248 adjust the variable current Ic1 and the variable current Ic2 according to the first control signals and the second control signals outputted by the counter module 30258, respectively. The frequency of the triangular wave VFT generated according to adjustment of the variable current Ic1 and the variable current Ic2 is also varied with the first control signals and the second control signals outputted by the counter module 30258.

Figure 1A:
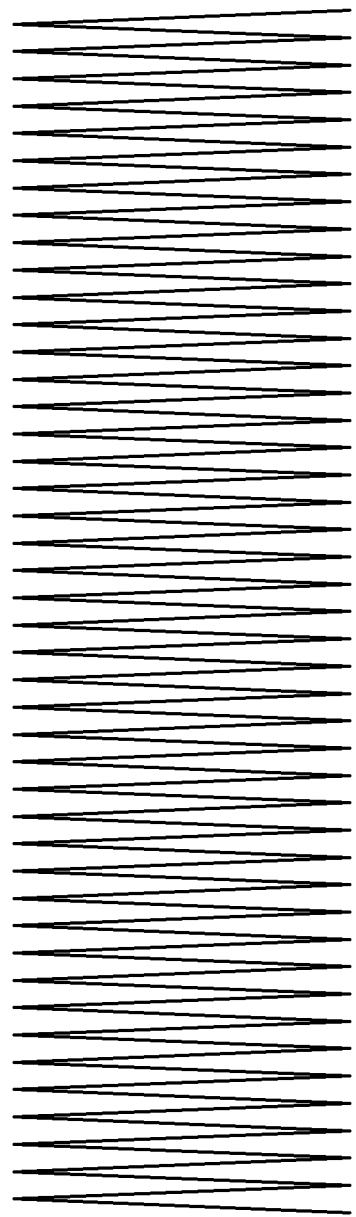
FIG. 1A is a diagram illustrating a triangular wave generated by a triangular wave generator.
Figure 1B:
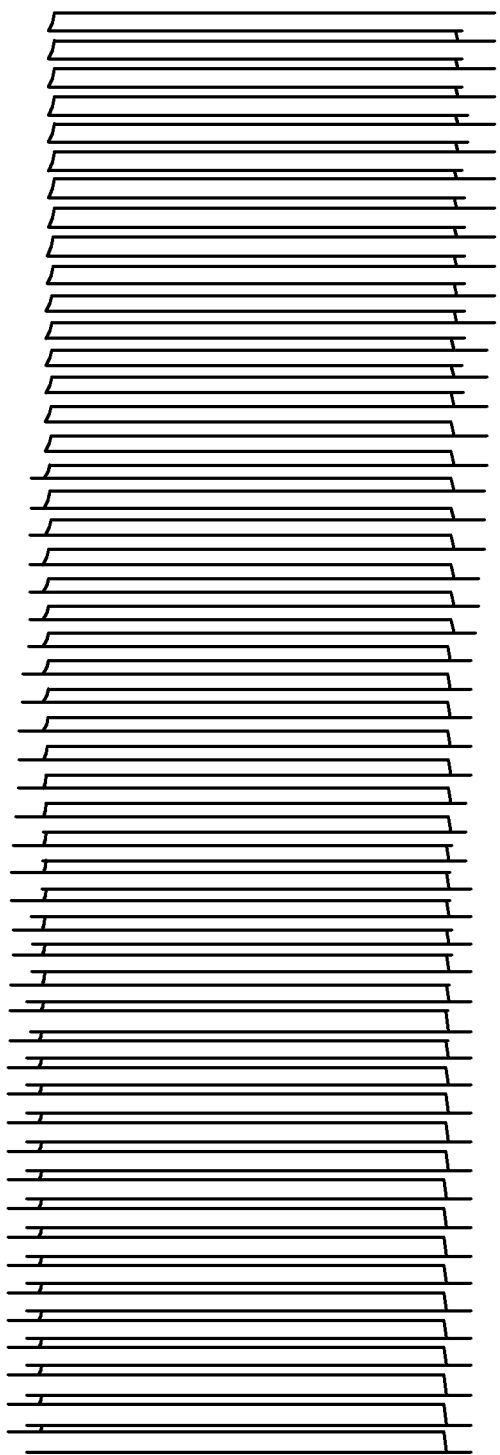
FIG. 1B is a diagram illustrating an output voltage outputted by a class-D power amplifier.
Figure 1C:
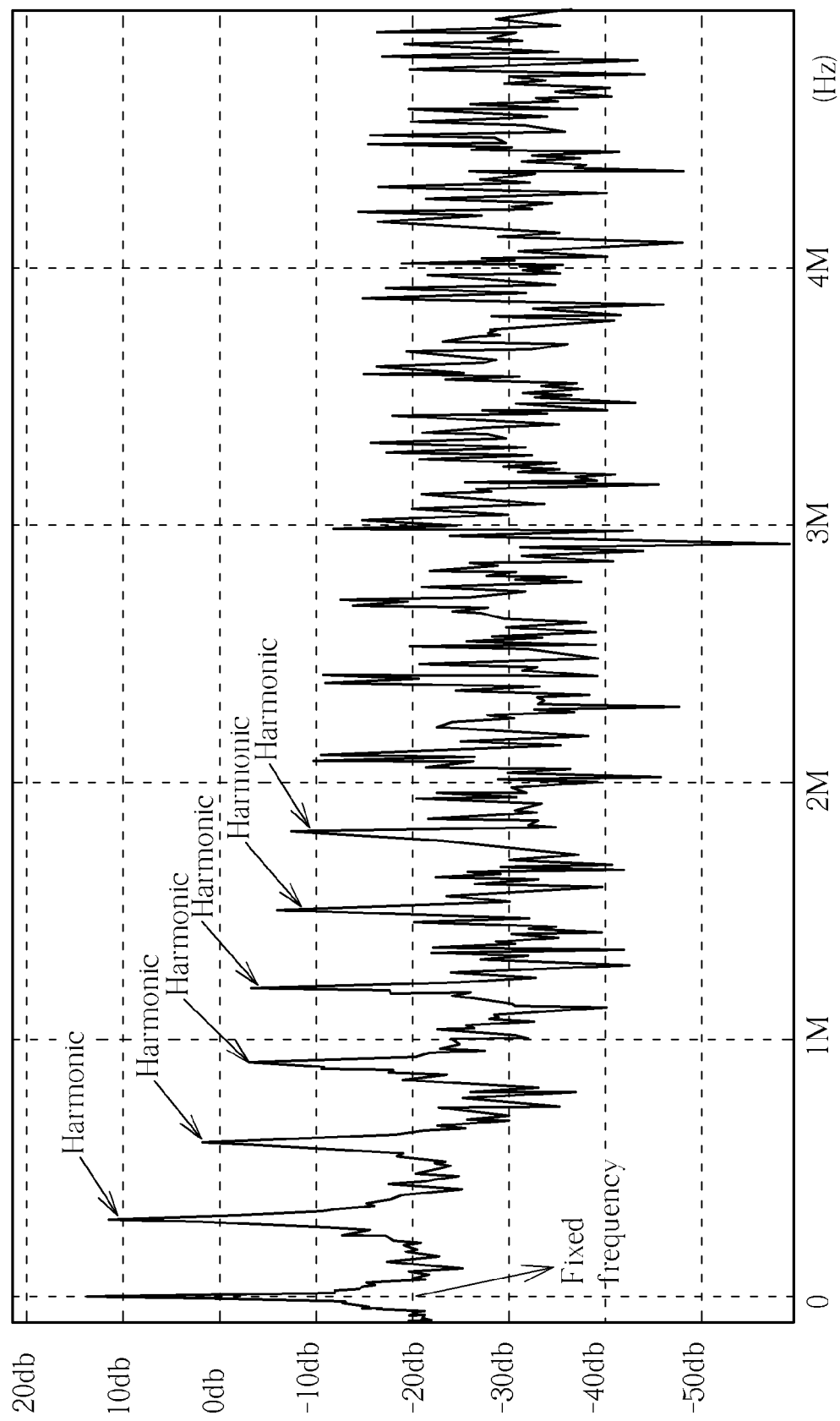
FIG. 1C is a diagram illustrating a fast Fourier transform analysis being executed on the output voltage outputted by the class-D power amplifier.
Figure 7B:
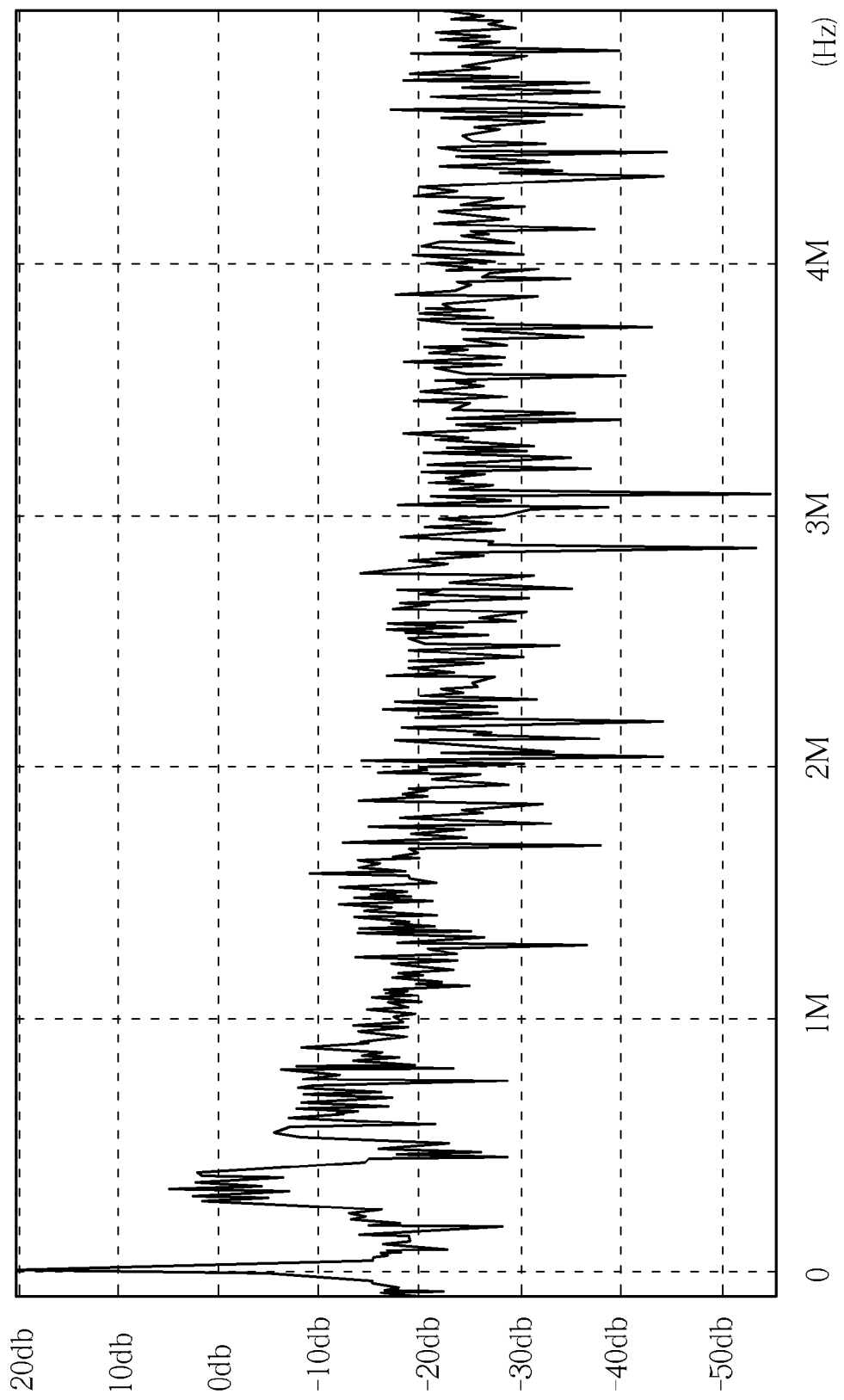
FIG. 7B is a diagram illustrating a spectrogram of the output voltage after the fast Fourier transform analysis is executed on the output voltage.

Please refer to FIG. 7B. FIG. 7B is a diagram illustrating a spectrogram of the output voltage DOUT after the fast Fourier transform analysis is executed on the output voltage DOUT. Compared the spectrogram in FIG. 7B with the spectrogram in FIG. 1C, a difference between the spectrogram in FIG. 7B and the spectrogram in FIG. 1C is that the spectrogram in FIG. 7B does not exhibit spikes corresponding to harmonics. Because a frequency of the output voltage DOUT outputted by the output stage circuit 3030 is the same as the frequency of the triangular wave VFT which can be changed and correspondingly adjusted, the spikes of the output voltage DOUT outputted by the output stage circuit 3030 can be effectively reduced, resulting in the electromagnetic interference of the class-D power amplifier 300 being also effectively reduced.

To sum up, the class-D power amplifier capable of reducing electromagnetic interference utilizes the control signals generated by the counter module to control the variable currents provided by the variable current source, resulting in the frequency of the triangular wave generated by the triangular wave generator being not fixed. Therefore, after the fast Fourier transform analysis is executed on the output voltage generated according to the triangular wave, the spectrogram of the output voltage does not exhibit a fixed frequency and harmonics of the fixed frequency. Thus, the class-D power amplifier of the present invention is capable of reducing the electromagnetic interference.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A triangular wave generator for generating a variable frequency triangular wave, the triangular wave generator comprising:
 a variable current source module for receiving a plurality of control signals to adjust an output current of the variable current source module, the variable current source module comprising a plurality of variable current source units, and each variable current source unit provides a variable current to the output current of the variable current source module, each variable current source unit comprising:
  a fixed current source circuit for providing a fixed current to the output current of the variable current source module; and
  a plurality of fine-tune current circuits coupled to the fixed current source circuit for providing a plurality of fine-tune currents to the output current of the variable current source module, wherein the plurality of fine-tune current circuits adjust the plurality of fine-tune currents through the plurality of control signals;
 an energy storage module coupled to the variable current source module for receiving the output current of the variable current source module to maintain a storage voltage;
 a comparison module coupled to the energy storage module for comparing the storage voltage, a high reference voltage, and a low reference voltage to generate a plurality of comparison signals; and a control module coupled between the comparison module and the variable current source module for receiving the plurality of comparison signals, and generating the plurality of control signals to adjust the output current of the variable current source module;

wherein a frequency of the variable frequency triangular wave is changed with the output current of the variable current source module.

2. A triangular wave generator for generating a variable frequency triangular wave, the triangular wave generator comprising:

a variable current source module for receiving a plurality of control signals to adjust an output current of the variable current source module, the variable current source module comprising:

a first variable current source module for receiving the plurality of control signals to adjust an output current of the first variable current source module;

a second variable current source module coupled to the first variable current source module for receiving the plurality of control signals to adjust an output current of the second variable current source module; and a switch module coupled between the first variable current source module and the second variable current source module for controlling the output current of the first variable current source module or the output current of the second variable current source module;

an energy storage module coupled to the variable current source module for receiving the output current of the variable current source module to maintain a storage voltage;

a comparison module coupled to the energy storage module for comparing the storage voltage, a high reference voltage, and a low reference voltage to generate a plurality of comparison signals; and a control module coupled between the comparison module and the variable current source module for receiving the plurality of comparison signals, and generating the plurality of control signals to adjust the output current of the variable current source module;

wherein a frequency of the variable frequency triangular wave is changed with the output current of the variable current source module.

3. A triangular wave generator for generating a variable frequency triangular wave, the triangular wave generator comprising:

a variable current source module for receiving a plurality of control signals to adjust an output current of the variable current source module;

an energy storage module coupled to the variable current source module for receiving the output current of the variable current source module to maintain a storage voltage;

a comparison module coupled to the energy storage module for comparing the storage voltage, a high reference voltage, and a low reference voltage to generate a plurality of comparison signals; and a control module coupled between the comparison module and the variable current source module for receiving the plurality of comparison signals, and generating the plurality of control signals to adjust the output current of the variable current source module, the control module comprising:

a flip-flop module for receiving the plurality of comparison signals to generate at least one switch signal to the variable current source module to control the output current of the variable current source module; and a counter module coupled to the flip-flop module for receiving the at least one switch signal, and counting number of the at least one switch signal to generate the plurality of control signals;

wherein a frequency of the variable frequency triangular wave is changed with the output current of the variable current source module.

* * * * *